United States Patent
Chu et al.

(10) Patent No.: US 12,484,282 B2
(45) Date of Patent: Nov. 25, 2025

(54) INTEGRATED CIRCUIT, TRANSISTOR AND METHOD OF FABRICATING THE SAME

(71) Applicant: Taiwan Semiconductor Manufacturing Company, Ltd., Hsinchu (TW)

(72) Inventors: Yi-Cheng Chu, Chiayi (TW); Tzu-Hsiang Hsu, Hsinchu County (TW); Pin-Cheng Hsu, Hsinchu County (TW); Chung-Te Lin, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 445 days.

(21) Appl. No.: 17/832,687

(22) Filed: Jun. 6, 2022

(65) Prior Publication Data

US 2023/0395673 A1   Dec. 7, 2023

(51) Int. Cl.
*H01L 29/423* (2006.01)
*H10D 30/01* (2025.01)
*H10D 30/69* (2025.01)
*H10D 64/27* (2025.01)

(52) U.S. Cl.
CPC ....... *H10D 64/513* (2025.01); *H10D 30/0289* (2025.01); *H10D 30/696* (2025.01)

(58) Field of Classification Search
CPC ........... H01L 29/4236; H01L 29/42344; H01L 29/66704; H01L 29/7869; H01L 29/41733; H01L 29/4908; H01L 2029/42388; H01L 29/42384; C07J 9/005; C07J 31/006; C07J 21/006; C07J 41/0061

See application file for complete search history.

(56) References Cited

U.S. PATENT DOCUMENTS

| | | | |
|---|---|---|---|
| 2013/0134412 A1* | 5/2013 | Godo | H01L 29/7869 257/E29.296 |
| 2017/0170211 A1* | 6/2017 | Yamazaki | H01L 29/7782 |
| 2018/0026039 A1* | 1/2018 | Chang | H10D 64/017 257/369 |
| 2019/0088759 A1* | 3/2019 | Sung | H10D 64/518 |
| 2023/0292495 A1* | 9/2023 | Kim | H10B 12/053 |

* cited by examiner

Primary Examiner — Mohammed R Alam
(74) Attorney, Agent, or Firm — JCIPRNET

(57) ABSTRACT

A transistor includes a gate electrode, a gate dielectric, a channel layer and a source line and bit line. The gate electrode includes a first gate material layer and a second gate material layer disposed on the first gate material layer, wherein a work function of the first gate material layer is lower than a work function of the second gate material layer. The gate dielectric is disposed on the gate electrode. The channel layer is disposed on the gate dielectric. The source line and bit line are disposed on and connected to the channel layer.

20 Claims, 16 Drawing Sheets

INTEGRATED CIRCUIT, TRANSISTOR AND METHOD OF FABRICATING THE SAME

BACKGROUND

The semiconductor integrated circuit (IC) industry has experienced a fast-paced growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component or line that can be created using a fabrication process) has decreased. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1:
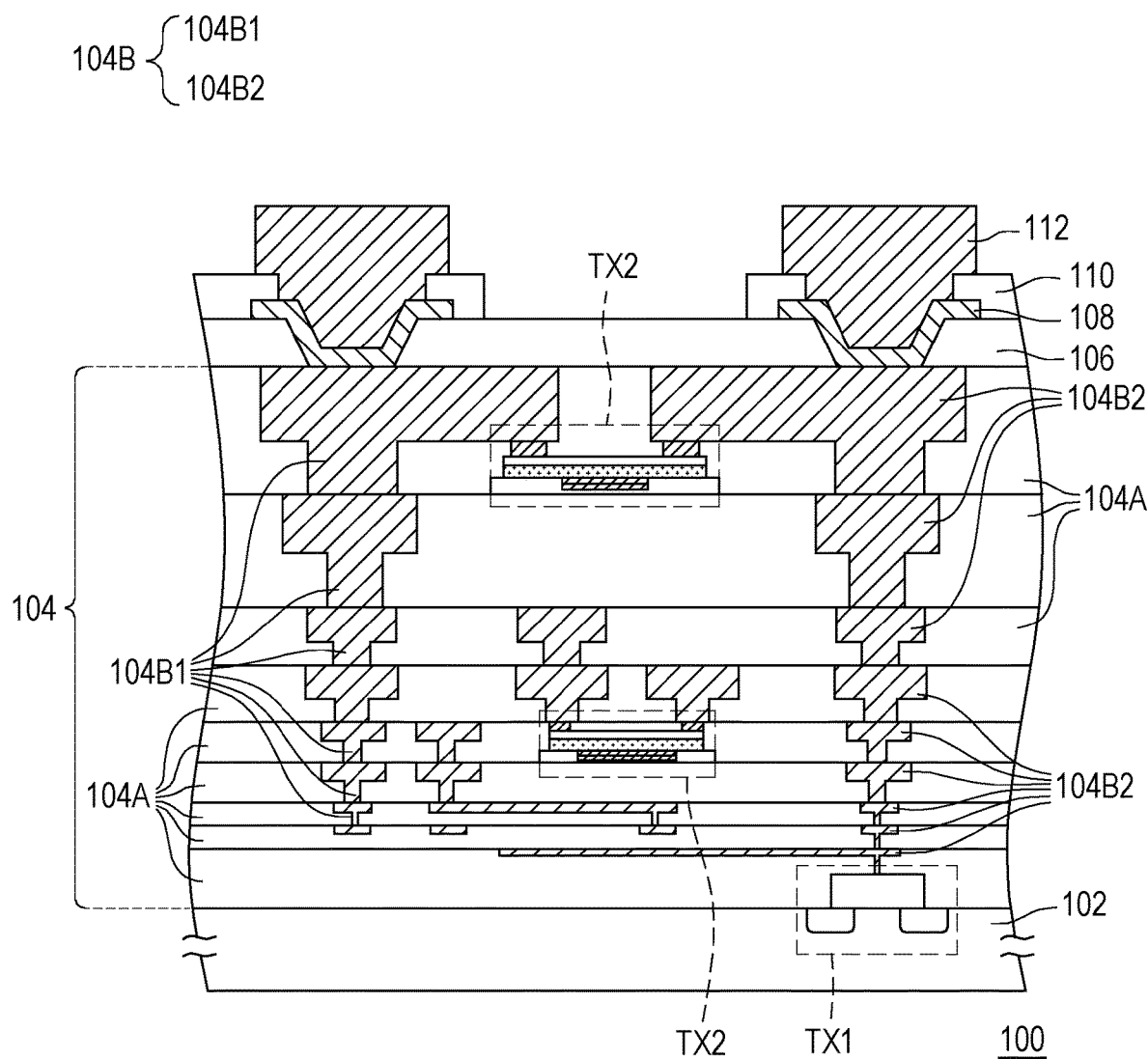
FIG. 1 is a schematic cross-sectional view of an integrated circuit in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Conventional back gate thin film transistors include a gate electrode made of a single material. In general, it is difficult for the single gate material to meet all demands regarding work function, resistivity, and surface roughness control etc. In accordance with some embodiments of the present disclosure, a transistor including a gate electrode that meets the demand of low resistivity, high work function and low surface roughness, and can be stably controlled is described.

FIG. 1 is a schematic cross-sectional view of an integrated circuit in accordance with some embodiments of the disclosure. In some embodiments, the integrated circuit 100 includes a substrate 102, an interconnection layer 104, a passivation layer 106, a post-passivation layer 110, a plurality of conductive pads 108, and a plurality of conductive terminals 112. In some embodiments, the substrate 102 is made of elemental semiconductor materials, such as crystalline silicon, diamond, or germanium; compound semiconductor materials, such as silicon carbide, gallium arsenic, indium arsenide, or indium phosphide; or alloy semiconductor materials, such as silicon germanium, silicon germanium carbide, gallium arsenic phosphide, or gallium indium phosphide. The substrate 102 may be a bulk silicon substrate, a silicon-on-insulator (SOI) substrate, or a germanium-on-insulator (GOI) substrate.

In some embodiments, the substrate 102 includes various doped regions depending on circuit requirements (e.g., p-type semiconductor substrate or n-type semiconductor substrate). In some embodiments, the doped regions are doped with p-type dopants or n-type dopants. For example, the doped regions may be doped with p-type dopants, such as boron or $BF_2$; n-type dopants, such as phosphorus or arsenic; and/or combinations thereof. In some embodiments, these doped regions serve as source/drain regions of a transistor TX1, which is formed over the substrate 102. Depending on the types of the dopants in the doped regions, the transistor TX1 may be referred to as n-type transistor or p-type transistor. In some embodiments, the transistor TX1 further includes a metal gate and a channel under the metal gate. The channel is located between the source region and the drain region to serve as a path for electron to travel when the transistor TX1 is turned on. On the other hand, the metal gate is located above the substrate 102 and is embedded in the interconnection layer IC1. In some embodiments, the transistor TX1 is formed using suitable Front-end-of-line (FEOL) process. For simplicity, one transistor TX1 is shown in FIG. 1. However, it should be understood that more than one transistor TX1 may be presented depending on the application of the integrated circuit 100. When multiple transistors TX1 are presented, these transistors TX1 may be separated by shallow trench isolation (STI; not shown) located between two adjacent transistors TX1.

As illustrated in FIG. 1, the interconnection layer 104 is formed over the substrate 102. In some embodiments, the interconnection layer 104 includes a plurality of dielectric layers 104A and a plurality of conductive layers 104B alternately stacked up along a build-up direction. The interconnection layer 104 further includes a plurality of transistors TX2 located in between the plurality of dielectric layers 104A.

In some embodiments, the conductive layers 104B include conductive vias 104B1 and conductive patterns 104B2 embedded in the dielectric layers 104A. In some embodiments, the conductive patterns 104B2 located at different level heights are connected to one another through the conductive vias 104B1. In other words, the conductive patterns 104B2 are electrically connected to one another through the conductive vias 104B1. In some embodiments, the bottommost conductive vias 104B1 are connected to the transistor TX1. For example, the bottommost conductive vias 104B1 are connected to the metal gate, which is embedded in the bottommost dielectric layer 104A, of the transistor TX1. In other words, the bottommost conductive vias 104B1 establish electrical connection between the transistor TX1 and the conductive patterns 104B2 of the interconnection layer 104. As illustrated in FIG. 1, the bottommost conductive via 104B1 is connected to the metal gate of the transistor TX1. It should be noted that in some alternative cross-sectional views, other bottommost conductive vias 104B1 are also connected to source/drain regions of the transistor TX1. That is, in some embodiments, the bottommost conductive vias 104B1 may be referred to as "contact structures" of the transistor TX1.

In some embodiments, the dielectric layers 104A include materials such as polyimide, epoxy resin, acrylic resin, phenol resin, benzocyclobutene (BCB), polybenzooxazole (PBO), or any other suitable polymer-based dielectric material. Alternatively, the dielectric layers 104A may be formed of oxides or nitrides, such as silicon oxide, silicon nitride, or the like. The dielectric layers 104A may be formed by suitable fabrication techniques such as spin-on coating, chemical vapor deposition (CVD), plasma-enhanced chemical vapor deposition (PECVD), or the like.

In some embodiments, the conductive layers 104B include materials such as aluminum, titanium, copper, nickel, tungsten, or alloys thereof. The conductive layers 104B (including conductive patterns 104B2 and the conductive vias 104B1) may be formed by electroplating, deposition, and/or photolithography and etching. In some embodiments, the conductive patterns 104B2 and the underlying conductive vias 104B1 are formed simultaneously. It should be noted that the number of the dielectric layers 104A, the number of the conductive layers 104B illustrated in FIG. 1 are merely for illustrative purposes, and the disclosure is not limited thereto. In some alternative embodiments, fewer or more layers of the dielectric layers 104A and the conductive layers 104B may be formed depending on the circuit design.

As illustrated in FIG. 1, the transistors TX2 are embedded in the interconnection layer 104. For example, each transistor TX2 may be embedded in one of the dielectric layers 104A. In some embodiments, the transistors TX2 are electrically connected to the conductive patterns 104B2 through the corresponding conductive vias 104B1. In some embodiments, the transistors TX2 may be arranged in an array (e.g. array of transistors/array of memory cells) in each of the dielectric layers 104A. The formation method and the structure of the transistors TX2 will be described in detail later.

As illustrated in FIG. 1, the passivation layer 106, the conductive pads 108, the post-passivation layer 110, and the conductive terminals 112 are sequentially formed on the interconnection layer 104. In some embodiments, the passivation layer 106 is disposed on the topmost dielectric layer 104A and the topmost conductive layer 104B (conductive pattern 104B2). In some embodiments, the passivation layer 106 has a plurality of openings partially exposing the topmost conductive patterns 104B2. In some embodiments, the passivation layer 106 is a silicon oxide layer, a silicon nitride layer, a silicon oxy-nitride layer, or a dielectric layer formed by other suitable dielectric materials. The passivation layer 106 may be formed by suitable fabrication techniques such as (high-density plasma chemical vapor deposition) HDP-CVD, PECVD, or the like.

In some embodiments, the conductive pads 108 are formed over the passivation layer 106. In some embodiments, the conductive pads 108 extend into the openings of the passivation layer 106 to be in direct contact with the topmost conductive patterns 104B2. That is, the conductive pads 108 are physically and electrically connected to the interconnection layer 104. In some embodiments, the conductive pads 108 include aluminum pads, titanium pads, copper pads, nickel pads, tungsten pads, or other suitable metal pads. The conductive pads 108 may be formed by, for example, electroplating, deposition, and/or photolithography and etching. It should be noted that the number and the shape of the conductive pads 108 illustrated in FIG. 1 are merely for illustrative purposes, and the disclosure is not limited thereto. In some alternative embodiments, the number and the shape of the conductive pads 108 may be adjusted based on demand.

In some embodiments, the post-passivation layer 110 is formed over the passivation layer 106 and the conductive pads 108. In some embodiments, the post-passivation layer 110 is formed on the conductive pads 108 to protect the conductive pads 108. In some embodiments, the post-passivation layer 110 has a plurality of contact openings partially exposing each conductive pad 108. The post-passivation layer 110 may be a polyimide layer, a PBO layer, or a dielectric layer formed by other suitable polymers. In some embodiments, the post-passivation layer 110 is formed by suitable fabrication techniques such as HDP-CVD, PECVD, or the like.

As further illustrated in FIG. 1, the conductive terminals 112 are formed over the post-passivation layer 110 and the conductive pads 108. In some embodiments, the conductive terminals 112 extend into the contact openings of the post-passivation layer 110 to be in direct contact with the corresponding conductive pad 108. That is, the conductive terminals 112 are electrically connected to the interconnection layer 104 through the conductive pads 108. In some embodiments, the conductive terminals 112 are conductive pillars, conductive posts, conductive balls, conductive bumps, or the like. In some embodiments, a material of the conductive terminals 112 includes a variety of metals, metal alloys, or metals and mixture of other materials. For example, the conductive terminals 112 may be made of aluminum, titanium, copper, nickel, tungsten, tin, and/or alloys thereof. The conductive terminals 112 are formed by, for example, deposition, electroplating, screen printing, or other suitable methods. In some embodiments, the conductive terminals 112 are used to establish electrical connection with other components (not shown) subsequently formed or provided. Up to here, an integrated circuit 100 in accordance with some embodiments of the present disclosure is accomplished.

As illustrated in FIG. 1, a plurality of transistors TX2 are embedded in the interconnection layer 104 in between the dielectric layers 104A. The formation method and the structure of the transistor TX2 will be described in more detail by referring to FIG. 2A to FIG. 2L shown below.

Figure 2A:
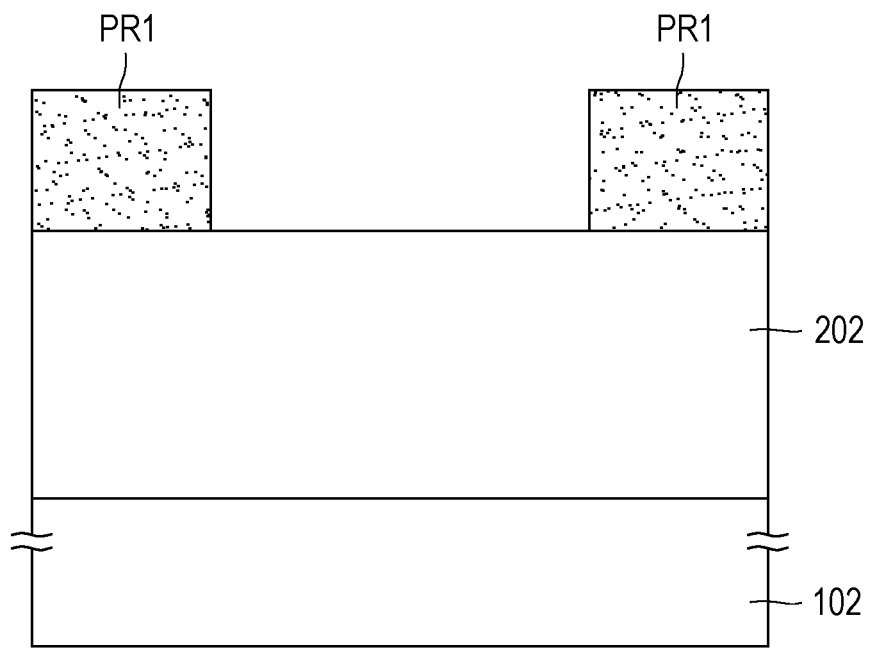
FIG. 2A to FIG. 2L are schematic cross-sectional views illustrating various stages in a method of fabricating a transistor as shown in FIG. 1 according to some embodiments of the disclosure.

FIG. 2A to FIG. 2L are schematic cross-sectional views illustrating various stages in a method of fabricating a transistor as shown in FIG. 1 according to some embodiments of the disclosure. Referring to FIG. 2A, a dielectric layer 202 is formed over the substrate 102 of the integrated circuit 100. In some embodiments, the dielectric layer 202 may be any formed directly on the substrate 102 and contacting the substrate 102. Alternatively, there may be a plurality of dielectric layers 104A located in between the dielectric layer 202 and the substrate 102. In other words, the dielectric layer 202 may correspond to the dielectric layers 104A located at any level of the interconnection layer 104 shown in FIG. 1. In some embodiments, the dielectric layer 202 includes silicon oxide, silicon nitride, silicon oxynitride, or the like, which may be deposited by CVD, physical vapor deposition (PVD), atomic layer deposition (ALD), PECVD, or the like.

As illustrated in FIG. 2A, a photoresist pattern PR1 is formed over the dielectric layer 202. The photoresist pattern PR1 include openings that reveal a top surface of the dielectric layer 202. For example, in some embodiments, the openings correspond to a shape of a gate electrode, or portions of the gate electrode formed in subsequent steps. In other words, the shape of the photoresist pattern PR1 is not particularly limited, and will depend on the design requirements of the gate electrode. In one embodiment, the photoresist pattern PR1 may be formed by coating (such as spin-coating) and photolithography processes or the like; however, the disclosure is not limited thereto. A material of the photoresist pattern PR1, for example, includes a positive resist material or a negative resist material, that is suitable for a patterning process such as a photolithography process with a mask or a mask-less photolithography process (for instance, an electron-beam (e-beam) writing or an ion-beam writing).

Figure 2B:
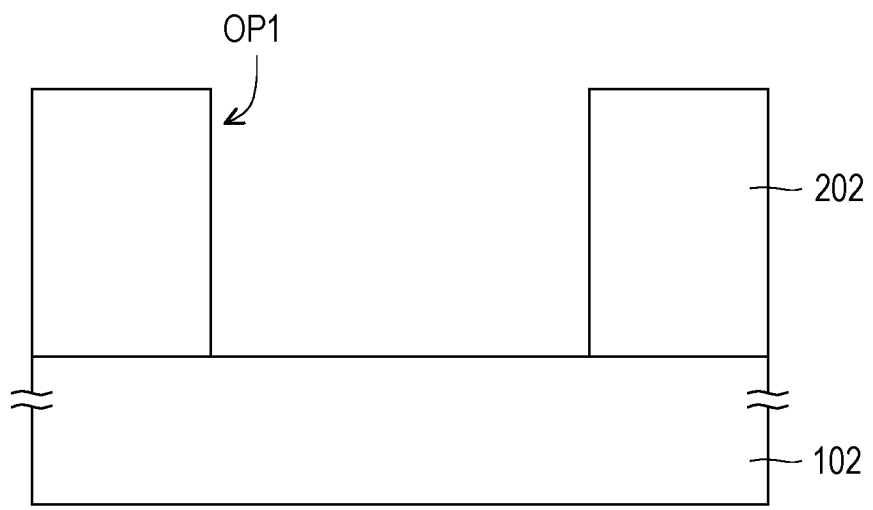

Referring to FIG. 2B, after providing the photoresist pattern PR1 on the dielectric layer 202, an etching process is performed to remove portions of the dielectric layer 202. For example, portions of the dielectric layer 202 not covered by the photoresist pattern PR1 are removed. In certain embodiments, the dielectric layer 202 is etched or patterned to form a first opening OP1. In some embodiments, an etch stop layer (not shown) may be located below the dielectric layer 202, to help stop the etching process when forming the first opening OP1. Although only one first opening OP1 is illustrated herein, it should be noted that the number of first openings OP1 formed in the dielectric layer 202 will correspond to the number of gate electrodes formed in the interconnection layer 104 of the integrated circuit 100.

Figure 2C:
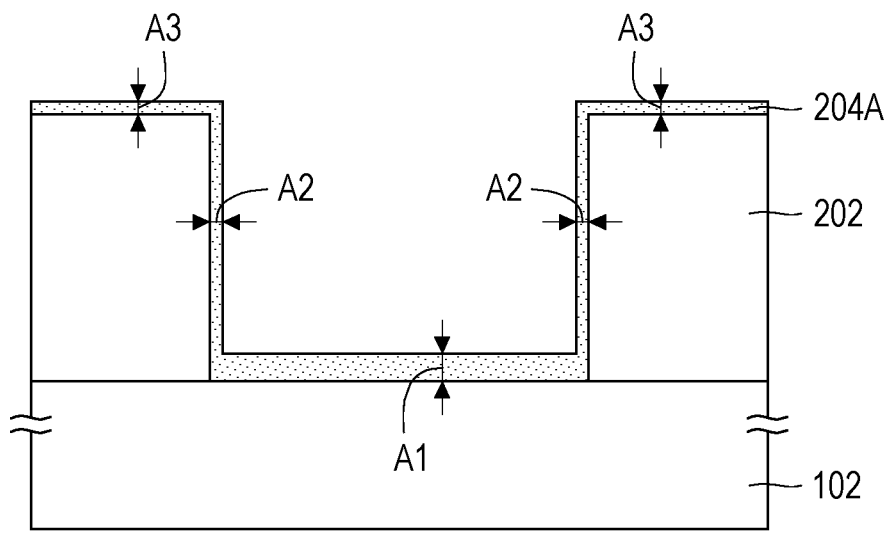

Referring to FIG. 2C, in a subsequent step, a glue layer 204A is conformally formed over the dielectric layer 202 and within the first opening OP1. The glue layer 204A is formed to help adhesion, reduce resistance and prevent diffusion of the subsequently formed first gate material layer. In some embodiments, the glue layer 204A may be a conductive material such as a metal nitride, and the metal nitride may include titanium nitride, tantalum nitride, molybdenum nitride, zirconium nitride, hafnium nitride, or the like. Furthermore, the glue layer 204A may be formed by an acceptable deposition process such as CVD, PVD, ALD, PECVD, or the like.

As illustrated in FIG. 2C, the glue layer 204A formed at the bottom surface of the first opening OP1 has a thickness of A1, while the glue layer 204A formed on sidewalls and on a top surface of the dielectric layer 202 has thicknesses of A2 and A3, whereby A1>A2=A3. In other words, the glue layer 204A formed at the bottom surface of the first opening OP1 has a greater thickness, while the glue layer 204A formed on sidewalls and on a top surface of the dielectric layer 202 has smaller thickness.

Figure 2D:
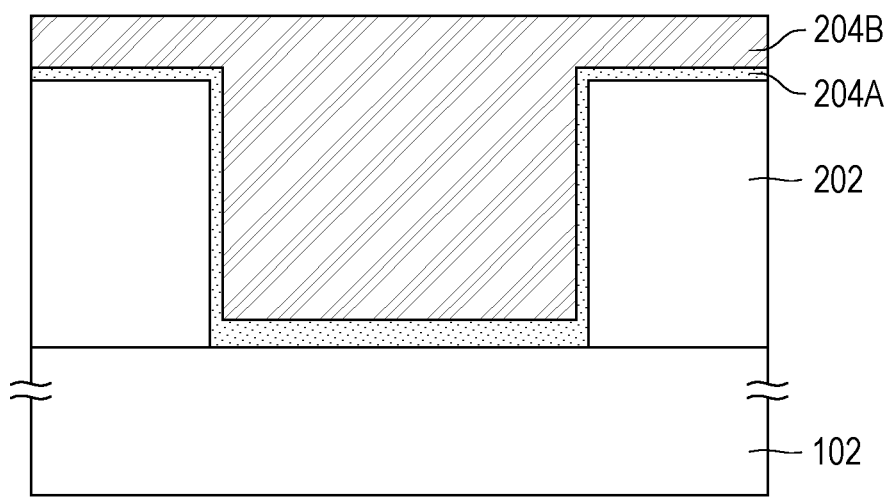
Figure 2E:
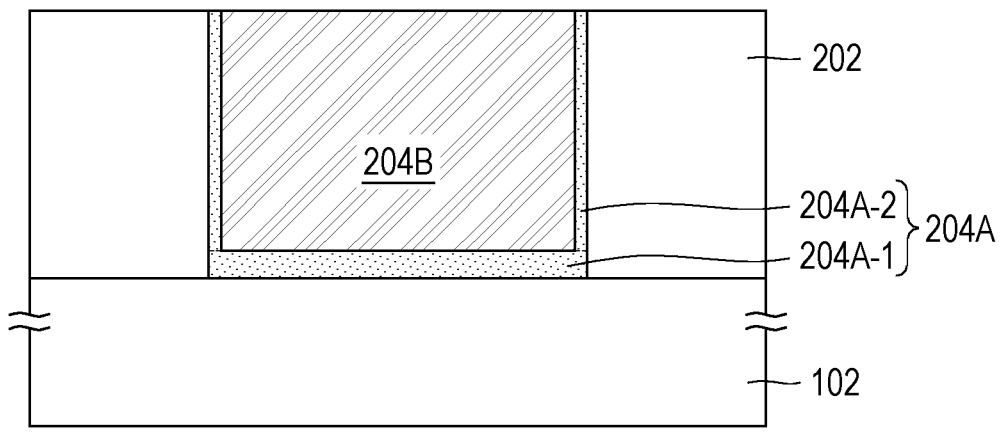

Referring to FIG. 2D, in a subsequent step, a first gate material layer 204B is formed in the first opening OP1 and over the glue layer 204A. In the exemplary embodiment, the first gate material layer 204B is a metal material with low resistivity for providing a good conductive path of the gate electrode. For example, the first gate material layer 204B may be selected from the group consisting of titanium nitride (TiN), aluminum (Al), copper (Cu), cobalt (Co) and gold (Au), or the like. In some embodiments, the first gate material layer 204B is formed by an acceptable deposition process such as CVD, PVD, ALD, PECVD, or the like. Subsequent, referring to FIG. 2E, a planarization process (e.g., a chemical-mechanical planarization (CMP) process) is performed to remove excessive conductive material of the first gate material layer 204B. For example, after the planarization process, top surfaces of the glue layer 204A and the first gate material layer 204B may be substantially aligned and coplanar with the top surface of the dielectric layer 202.

Figure 2F:
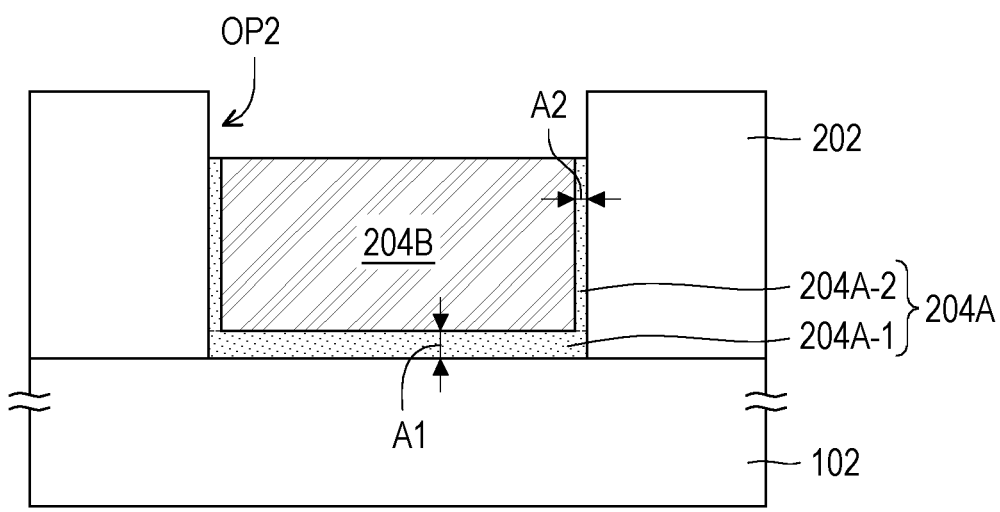

Referring to FIG. 2F, in some embodiments, portions of the glue layer 204A and portions of the first gate material layer 204B are removed in the same step to form a second opening OP2. In certain embodiments, the glue layer 204A and the first gate material layer 204B are removed through suitable etching process such as a dry etch (e.g., reactive ion etch (RIE), a neutral beam etch (NBE), the like), a wet etch, the like, or a combination thereof. The glue layer 204A and the first gate material layer 204B are removed due to their etching selectivity over the dielectric layer 202. Upon completion of the etching process, the glue layer 204A is formed with a base portion 204A-1 and sidewall portions 204A-2 connected to the base portion. For example, a thickness A1 of the base portion 204A-1 is greater than a thickness A2 of the sidewall portions 204A-2. The base portion 204A-1 of the glue layer 204A may cover a bottom surface of the first gate material layer 204B, while the sidewall portions 204A-2 may cover sidewalls of the first gate material layer 204B.

Figure 2G:
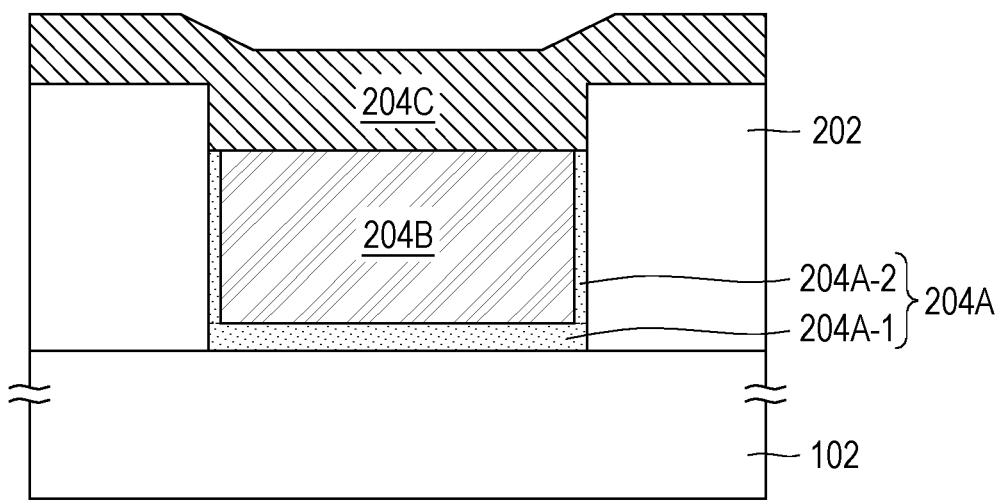

Referring to FIG. 2G, in a subsequent step, a second gate material layer 204C is formed in the second opening OP2 and on the first gate material layer 204B and on the glue layer 204A. For example, the second gate material layer 204C is stacked on top of the first gate material layer 204B along a build-up direction of the interconnection layer 104 shown in FIG. 1. In some embodiments, the second gate material layer 204C is formed over the top surface of the dielectric layer 202. In the exemplary embodiment, the second gate material layer 204C is a metal material having high work function and low surface roughness. For example, the second gate material layer 204C may be selected from the group consisting of tungsten (W), tungsten carbon nitride (WCN), tantalum nitride (TaN), nickel (Ni), chromium (Cr), or the like. In some embodiments, the second gate material layer 204C is formed by an acceptable deposition process such as CVD, PVD, ALD, PECVD, or the like. In the exemplary embodiment, the materials of the first gate material layer 204B and the second gate material layer 204C are selected so that a work function of the first gate material layer 204B is lower than a work function of the second gate material layer 204C. Furthermore, a resistivity of the first gate material layer 204B is lower than a resistivity of the second gate material layer 204C. By controlling the work function and resistivity of the selected gate material layer, the formed gate electrode may be stably controlled while having the desired properties. In some embodiments, the first gate material layer 204B and the second gate material layer 204C may have different phases. For example, in one embodiment, the first gate material layer 204B is a crystalline layer and the second gate material layer 204C is an amorphous layer. The phase difference brings about a lower resistivity for the first gate material layer 204B (crystalline) as compared with the second gate material layer 204C (amorphous).

Figure 2H:
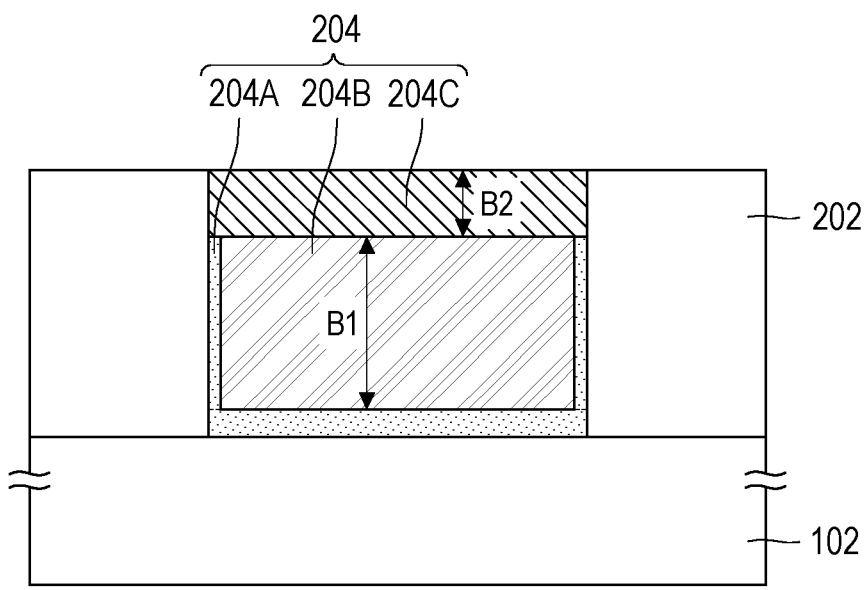

Referring to FIG. 2H, after forming the second gate material layer 204C, a planarization process (e.g., a CMP process) is performed to remove excessive conductive material of the second gate material layer 204C. For example, after the planarization process, a top surface of the second gate material layer 204C is substantially aligned and coplanar with a top surface of the dielectric layer 202. Upon completion of the planarization process, a gate electrode 204 including the glue layer 204A, the first gate material layer 204B and the second gate material layer 204C is accomplished. For example, the first gate material layer 204B is sandwiched in between the glue layer 204A and the second gate material layer 204C. In the gate electrode 204, a lateral dimension of the second gate material layer 204C is greater than a lateral dimension of the first gate material layer 204B. Furthermore, sidewalls of the second gate material layer 204C are aligned with sidewalls of the glue layer 204A.

In some embodiments, a ratio (B2:B1) of a thickness B2 of the second gate material layer 204C to a thickness B1 of the first gate material layer 204B is in a range of 1:2 to 1:50. In some embodiments, the ratio (B2:B1) of the thickness B2 of the second gate material layer 204C to the thickness B1 of the first gate material layer 204B is in a range of 1:5 to 1:40. In certain embodiments, the ratio (B2:B1) of the thickness B2 of the second gate material layer 204C to the thickness B1 of the first gate material layer 204B is in a range of 1:10 to 1:30. Furthermore, a minimum thickness of the second gate material layer 204C is for example, 10 Å (angstroms) or more. By using a gate electrode 204 including the first gate material layer 204B and second gate material layer 204C having the above thickness ratio, the high work function and low resistivity properties, and stable control of the gate electrode 204 may be ensured.

Figure 2I:
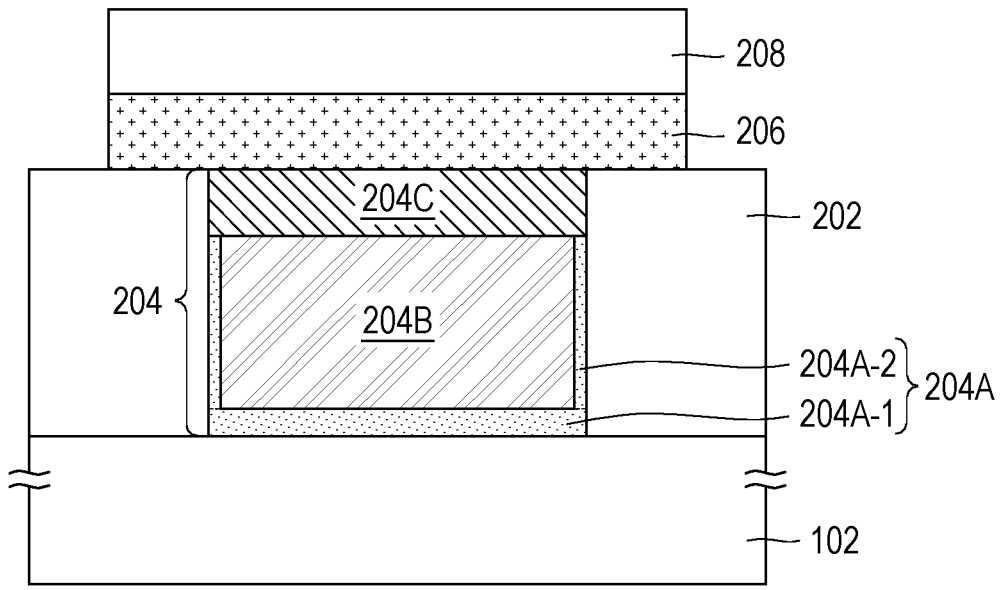

Referring to FIG. 2I, a gate dielectric 206 and a channel layer 208 are sequentially formed over the gate electrode 204 and over the dielectric layer 202. In some embodiments, the gate dielectric 206 includes silicon oxide, silicon nitride, silicon oxynitride, high-k dielectrics, or a combination thereof. It should be noted that the high-k dielectric materials are generally dielectric materials having a dielectric constant higher than 4, greater than about 12, greater than about 16, or even greater than about 20. In some embodiments, the gate dielectric includes metal oxides, metal nitrides, metal silicates, transition metal-oxides, transition metal-nitrides, transition metal-silicates, oxynitrides of metals, metal aluminates, or combinations thereof. For example, the gate dielectric 206 includes hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), zirconium silicate, zirconium aluminate, silicon nitride, silicon oxynitride, zirconium oxide, titanium oxide, aluminum oxide ($Al_2O_3$), hafnium dioxide-alumina ($HfO_2$—$Al_2O_3$) alloy, and/or combinations thereof.

The gate dielectric 206 may be formed by suitable fabrication techniques such as ALD, CVD, metal-organic CVD (MOCVD), PVD, thermal oxidation, UV-ozone oxidation, remote plasma atomic layer deposition (RPALD), plasma-enhanced atomic layer deposition (PEALD), molecular beam deposition (MBD), or combinations thereof. In some embodiments, a thickness of the gate dielectric 206 ranges from about 0.5 nm to about 10 nm. As illustrated in FIG. 2I, the gate dielectric 206 is disposed on the gate electrode 204 and the dielectric layer 202, wherein a portion of the gate dielectric 206 is in direct contact with the second gate material layer 204C, while another portion of the gate dielectric 206 is in direct contact with the dielectric layer 202.

As further illustrated in FIG. 2I, the channel layer 208 is disposed on the gate dielectric 206. In some embodiments, the channel layer 208 is made of oxide semiconductor materials such as indium-gallium-zinc oxide (InGaZnO), gallium oxide ($Ga_2O_3$), indium oxide ($In_2O_3$), zinc oxide (ZnO), indium tin oxide (ITO), indium tungsten oxide (IWO), or the like. In some embodiments, the channel layer 208 is formed by any suitable method, such as atomic layer deposition (ALD), chemical vapor deposition (CVD), metal organic chemical vapor deposition (MOCVD), plasma enhanced chemical vapor deposition (PECVD), sputtering or the like. Furthermore, the channel layer 208 may be single crystalline, poly crystalline, or amorphous. In some embodiments, the channel layer 208 and the gate dielectric 206 may be patterned together so that sidewalls of the channel layer 208 are aligned with sidewalls of the gate dielectric 206. The channel layer 208 and the gate dielectric 206 may be patterned by photolithography processes.

Figure 2J:
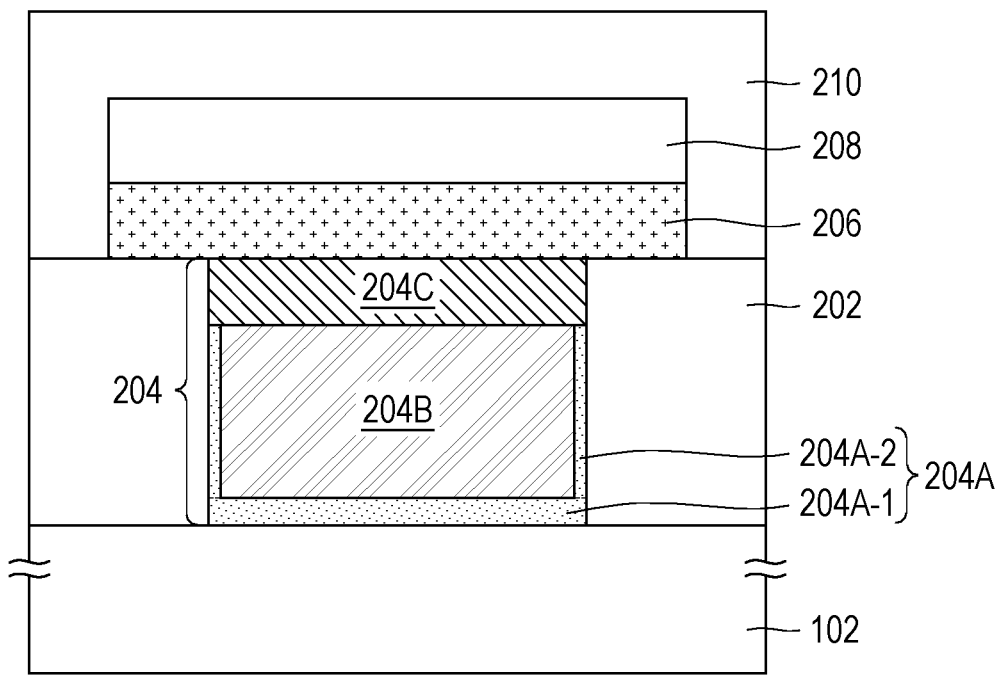

Referring to FIG. 2J, in a subsequent step, a dielectric layer 210 may be formed on the dielectric layer 202 to cover and surround the gate dielectric 206 and the channel layer 208. In some embodiments, the dielectric layer 210 include materials such as polyimide, epoxy resin, acrylic resin, phenol resin, benzocyclobutene (BCB), polybenzooxazole (PBO), or any other suitable polymer-based dielectric material. Alternatively, the dielectric layer 210 may be formed of oxides or nitrides, such as silicon oxide, silicon nitride, or the like. The dielectric layer 210 may be formed by suitable fabrication techniques such as spin-on coating, CVD, PECVD, or the like. In certain embodiments, the dielectric layer 210 corresponds to the dielectric layer 104A of the integrated circuit 100 (shown in FIG. 1).

Figure 2K:
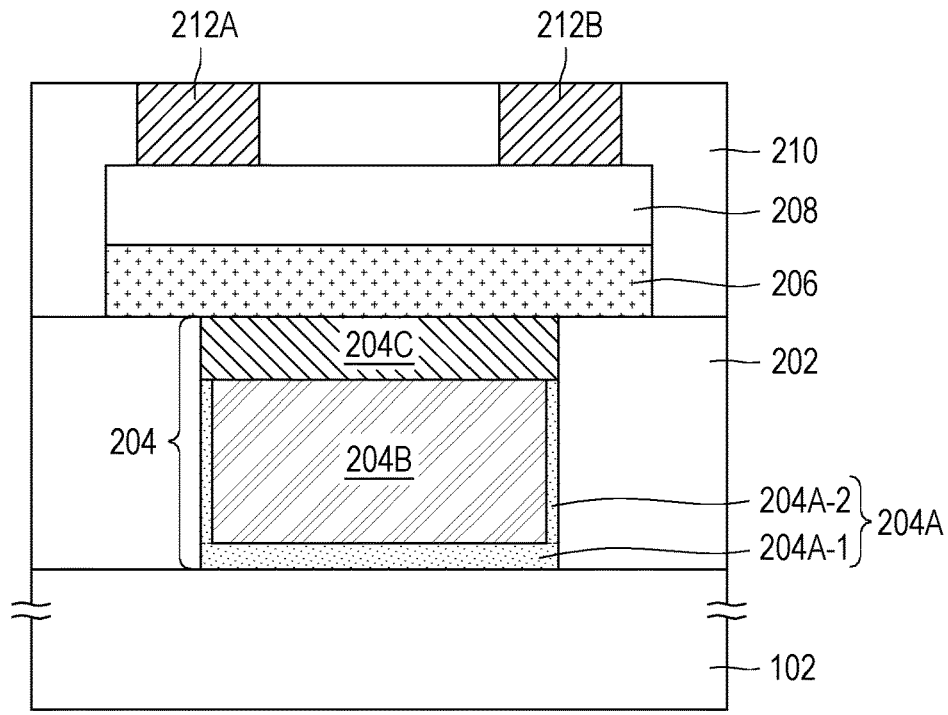

Referring to FIG. 2K, after forming the dielectric layer 210, the dielectric layer 210 may be patterned to form openings revealing the channel layer 208. Thereafter, a source line 212A and a bit line 212B are formed within the opening to be connected to the channel layer 208. In some embodiments, the source line 212A and the bit line 212B are surrounded by the dielectric layer 210. In certain embodiments, top surfaces of the source line 212A and the bit line 212B are aligned with a top surface of the dielectric layer 210. The source line 212A and the bit line 212B may be formed of conductive materials including copper, aluminum, tungsten, titanium nitride (TiN), tantalum nitride (TaN), some other conductive materials, or any combinations thereof. In some embodiments, the source line 212A and the bit line 212B are deposited through ALD, CVD, PVD, or the like.

Figure 2L:
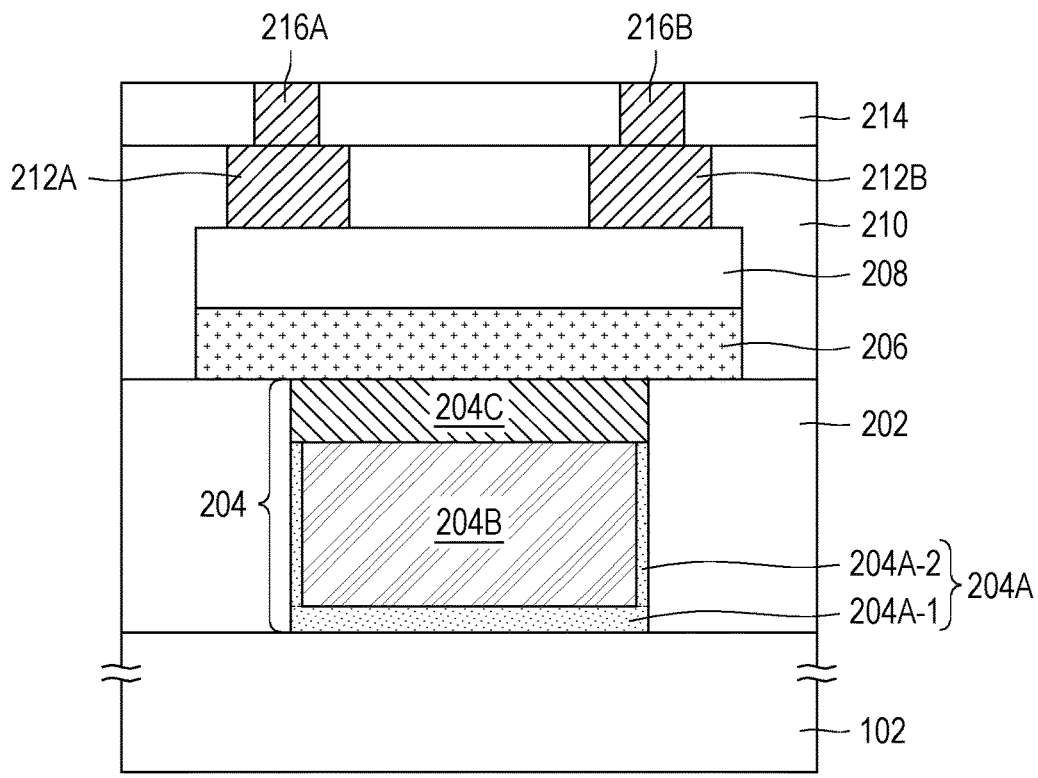

Referring to FIG. 2L, in a subsequent step, a passivation layer 214 is formed over the dielectric layer 210. The passivation layer 214 may be a silicon oxide layer, a silicon nitride layer, a silicon oxy-nitride layer, aluminum oxide layer, titanium oxide layer, or a dielectric layer formed of any suitable dielectric materials. The passivation layer 214 may be formed by CVD, PECVD, or the like. In some embodiments, the passivation layer 214 may be patterned to form openings revealing the source line 212A and the bit line 212B. Thereafter, a source line contact 216A and a bit line contact 216B may be formed in the openings to be electrically connected to the source line 212A and the bit line 212B.

In some embodiments, the source line contact 216A and the bit line contact 216B are formed by a similar material and similar process as with the source line 212A and the bit line 212B. Therefore, the details of the source line contact 216A and the bit line contact 216B will be omitted herein. In some embodiments, the source line contact 216A and the bit line contact 216B may be electrically connected to conductive layers 104B of the integrated circuit 100 (shown in FIG. 1). For example, the source line contact 216A and the bit line contact 216B may be electrically connected to the conductive vias 104B1 of the conductive layers 104B. Up to here, a transistor TX2-A in accordance with some embodiments of the present disclosure is accomplished. In the exemplary embodiment, since the transistor TX2-A includes a gate electrode 204 having a first gate material layer 204B and a second gate material layer 204C, the transistor TX2-A may meet various demands of having a high work function, low resistivity and low surface roughness properties, and stable control of the gate electrode 204 may be ensured.

Figure 3:
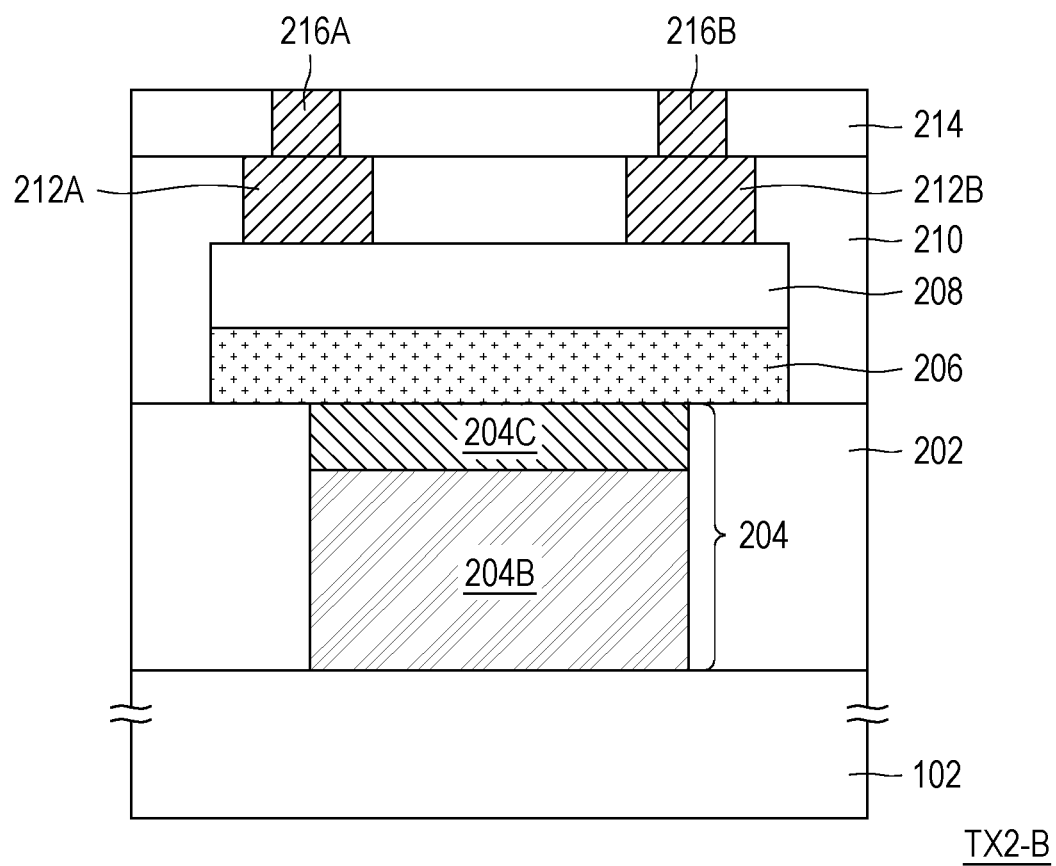
FIG. 3 is a schematic cross-sectional view of a transistor in accordance with some alternative embodiments of the present disclosure.

FIG. 3 is a schematic cross-sectional view of a transistor in accordance with some alternative embodiments of the present disclosure. The transistor TX2-B illustrated in FIG. 3 is similar to the transistor TX2-A illustrated in FIG. 2L. Therefore, the same reference numerals are used to refer to the same or like parts, and its detailed description will be omitted herein. The difference between the embodiments is that in the transistor TX2-B of FIG. 3, the glue layer 204A is omitted. In other words, the gate electrode 204 of FIG. 3 includes the first gate material layer 204B and the second gate material layer 204C, whereby side surfaces of the first gate material layer 204B and side surfaces of the second gate material layer 204C are aligned. By appropriate selection of a material of the first gate material layer 204B, the glue layer 204A may be omitted from the gate electrode 204. However, the selection of materials still fulfills the relationship where a work function of the first gate material layer 204B is lower than a work function of the second gate material layer 204C, and a resistivity of the first gate material layer 204B is lower than a resistivity of the second gate material layer 204C. Similar to the above embodiment, since the transistor TX2-B includes a gate electrode 204 having a first gate material layer 204B and a second gate material layer 204C, the transistor TX2-B may meet various demands of having a high work function, low resistivity and low surface roughness properties, and stable control of the gate electrode 204 may be ensured.

Figure 4A:
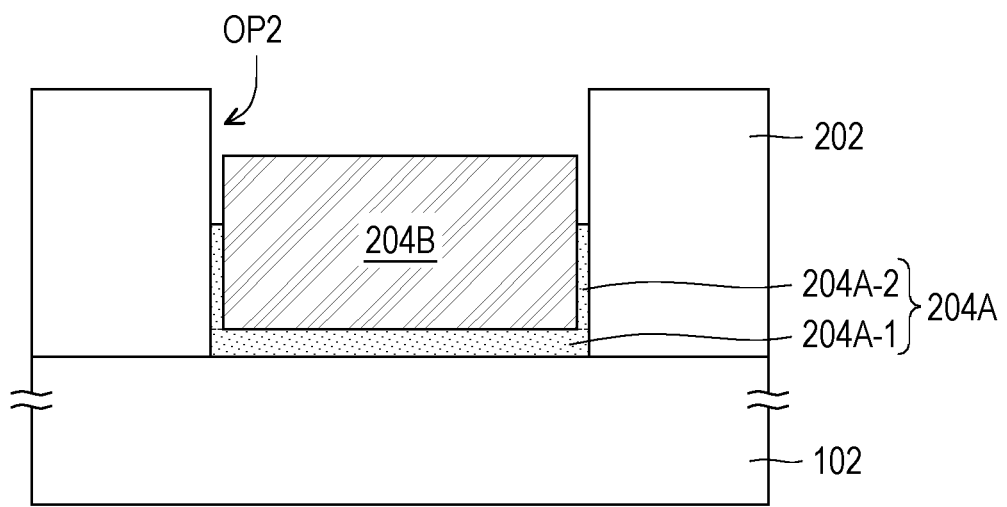
FIG. 4A to FIG. 4C are schematic cross-sectional views illustrating various stages in a method of fabricating a transistor as shown in FIG. 1 according to some other embodiments of the disclosure.
Figure 4B:
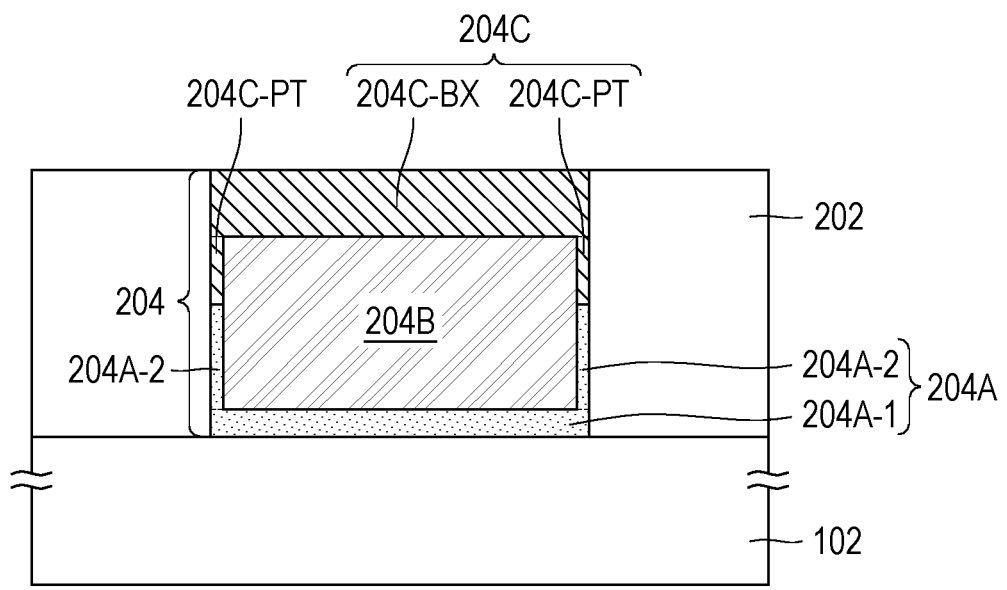
Figure 4C:
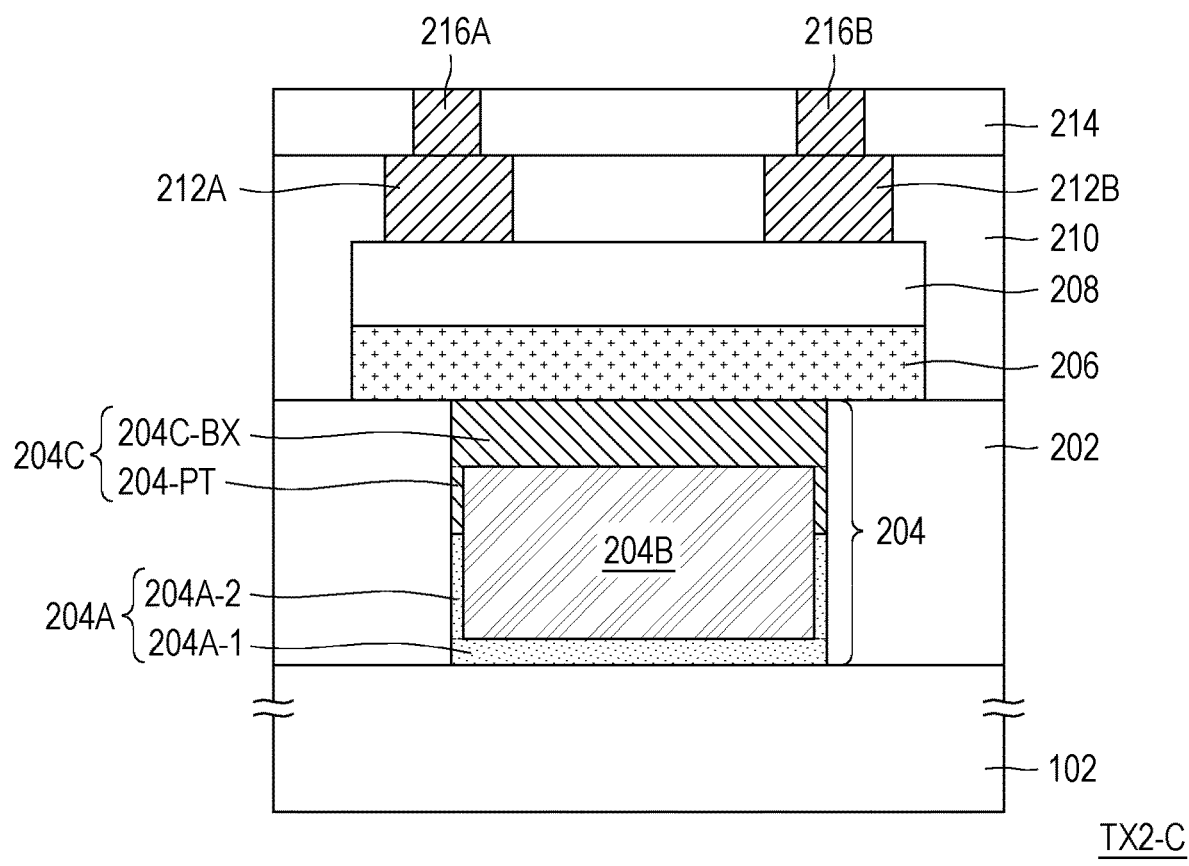

FIG. 4A to FIG. 4C are schematic cross-sectional views illustrating various stages in a method of fabricating a transistor as shown in FIG. 1 according to some other embodiments of the disclosure. The method illustrated in FIG. 4A to FIG. 4C is similar to the method illustrated in FIG. 2A to FIG. 2L. Therefore, the same reference numerals are used to refer to the same or liked parts, and its detailed description will be omitted herein. Referring to FIG. 4A, the same steps shown in FIG. 2A to FIG. 2E may be performed to form the first gate material layer 204B over the glue layer 204A. However, during an etching process (or etch back process) to remove the portions of the glue layer 204A and portions of the first gate material layer 204B to form the second opening OP2, the glue layer 204A may be over-etched due to its different etching selectivity with the first gate material layer 204B. In other words, a top surface (or top ends) of the glue layer 204A may be recessed from a top surface of the first gate material layer 204B, or the top surface of the first gate material layer 204B is located above a top surface of the glue layer 204A.

Referring to FIG. 4B, in a subsequent step, a second gate material layer 204C is formed in the second opening OP2 and on the first gate material layer 204B and on the glue layer 204A. Due to the over-etched glue layer 204A, the second gate material layer 204C may fill into gaps between the dielectric layer 202 and sidewalls 204B-SW of the first gate material layer 204B. In other words, the second gate material layer 204C may be formed with a body portion 204C-BX and a protruding portion 204C-PT. For example, the protruding portion 204C-PT is covering sidewalls 204B-SW of the first gate material layer 204B, and the body portion 204C-BX is located on the top surface of the first gate material layer 204B, and connected to the protruding portion 204C-PT. In some embodiments, the glue layer 204A covers a portion of sidewalls 204B-SW of the first gate material layer 204B, and the second gate material layer 204C is covering another portion of the sidewalls 204B-SW of the first gate material layer 204B. In certain embodiments, the sidewall portions 204A-2 of the glue layer 204A is covering a portion of sidewalls 204B-SW of the first gate material layer 204B, and the protruding portion 204C-PT of the second gate material layer 204C is covering another portion of the sidewalls 204B-SW of the first gate material layer 204B. Furthermore, the sidewall portions 204A-2 of the glue layer 204A may be connected to the protruding portion 204C-PT of the second gate material layer 204C.

Referring to FIG. 4C, the same steps shown in FIG. 2I to FIG. 2L may be performed to form the gate dielectric 206, the channel layer 208, the source line 212A and bit line 212B, and the source line contact 216A and bit line contact 216B over the gate electrode 204, and to form the dielectric layer 210 and the passivation layer 214 surrounding these elements. Up to here, a transistor TX2-C in accordance with some embodiments of the present disclosure is accomplished. Similar to the above embodiment, since the transistor TX2-C includes a gate electrode 204 having a first gate material layer 204B and a second gate material layer 204C, the transistor TX2-C may meet various demands of having a high work function, low resistivity and low surface roughness properties, and stable control of the gate electrode 204 may be ensured.

Figure 5A:
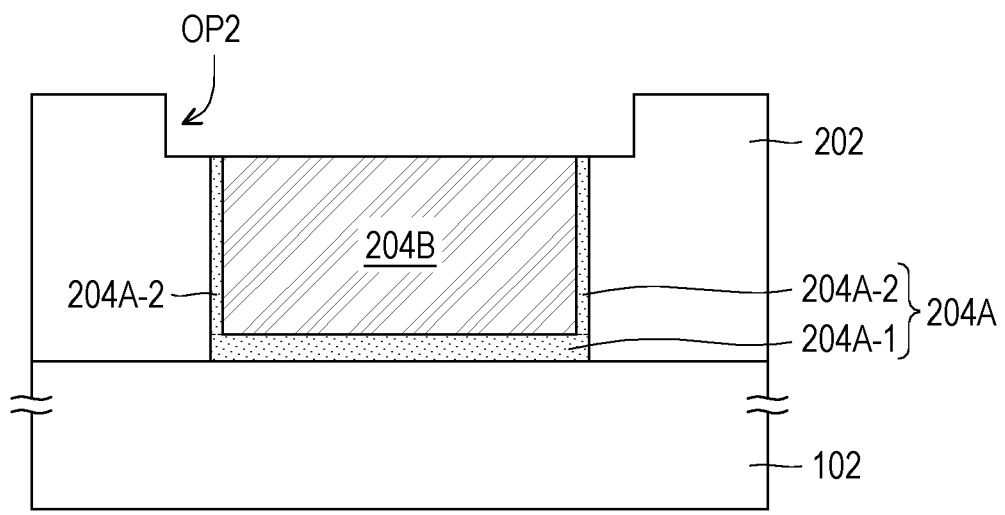
FIG. 5A to FIG. 5C are schematic cross-sectional views illustrating various stages in a method of fabricating a transistor as shown in FIG. 1 according to some other embodiments of the disclosure.
Figure 5B:
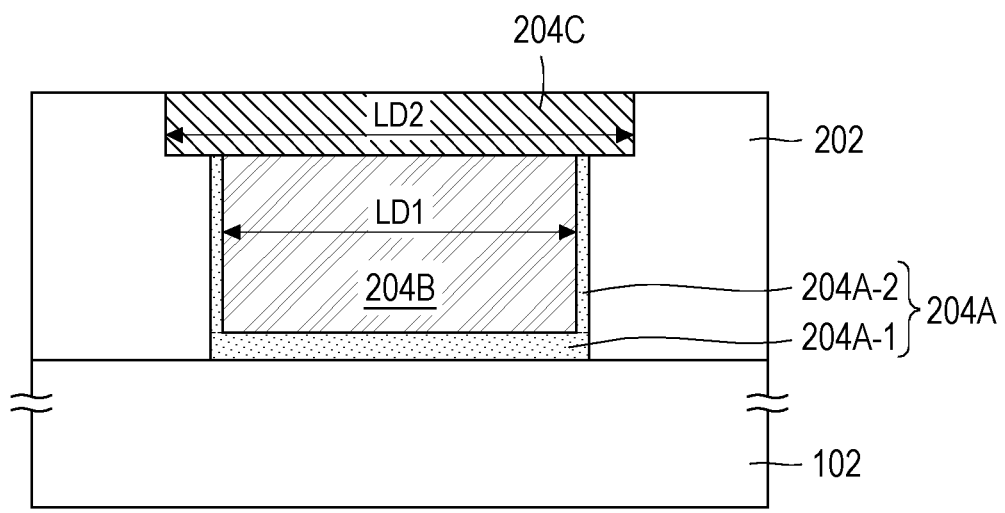
Figure 5C:
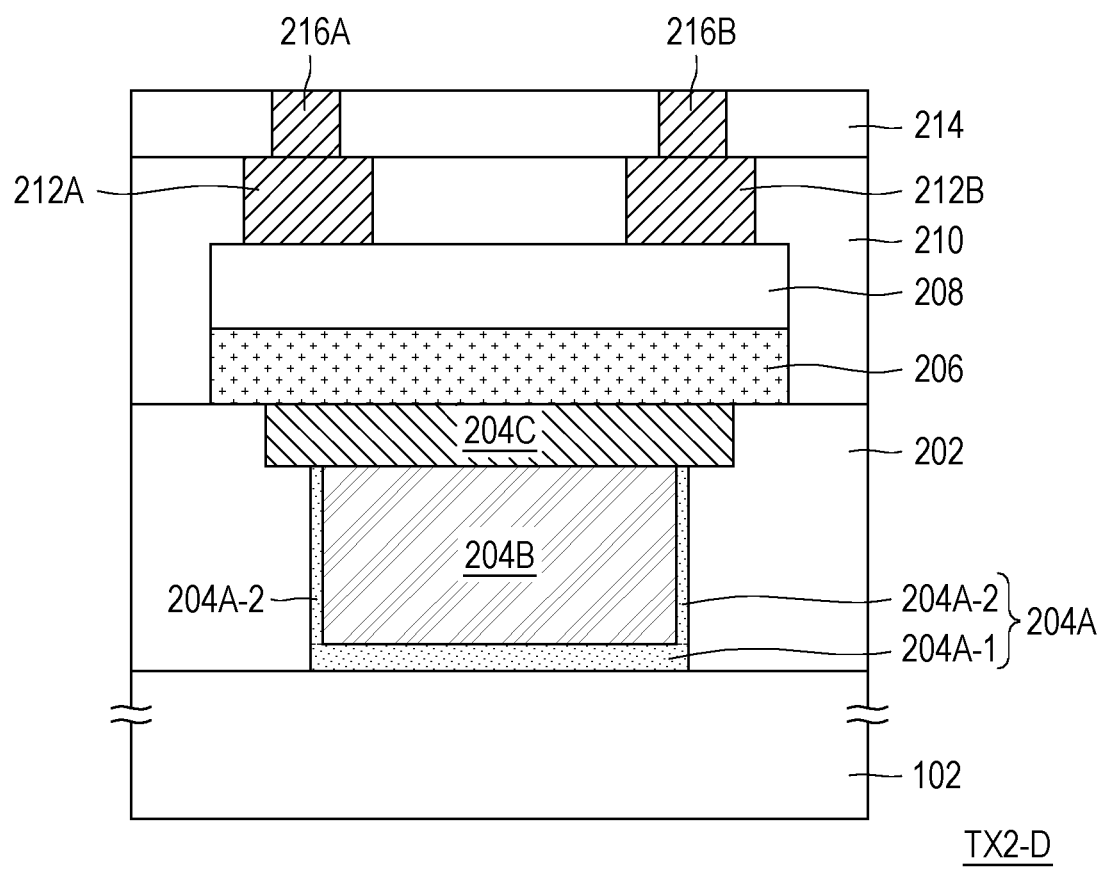

FIG. 5A to FIG. 5C are schematic cross-sectional views illustrating various stages in a method of fabricating a transistor as shown in FIG. 1 according to some other embodiments of the disclosure. The method illustrated in FIG. 4A to FIG. 4C is similar to the method illustrated in FIG. 2A to FIG. 2L. Therefore, the same reference numerals are used to refer to the same or liked parts, and its detailed description will be omitted herein. Referring to FIG. 5A, the same steps shown in FIG. 2A to FIG. 2E may be performed to form the first gate material layer 204B over the glue layer 204A. However, during an etching process (or etch back process) to remove the portions of the glue layer 204A and portions of the first gate material layer 204B to form the second opening OP2, a portion of the dielectric layer 202 may be further removed. The etching process may include a single etching process, or multiple etching processes.

Referring to FIG. 5B, in a subsequent step, a second gate material layer 204C is formed in the second opening OP2 and on the first gate material layer 204B and on the glue layer 204A. As illustrated in FIG. 5B a lateral dimension LD2 of the second gate material layer 204C is greater than a lateral dimension LD1 of the first gate material layer 204B. Furthermore, the lateral dimension LD2 of the second gate material layer 204C is greater than a sum of a thickness of the sidewall portions 204A-2 of the glue layer 204A and the lateral dimension LD1 of the first gate material layer 204B. In other words, sidewalls of the second gate material layer 204C extends beyond the sidewalls of the glue layer 204A.

Referring to FIG. 5C, the same steps shown in FIG. 2I to FIG. 2L may be performed to form the gate dielectric 206, the channel layer 208, the source line 212A and bit line 212B, and the source line contact 216A and bit line contact 216B over the gate electrode 204, and to form the dielectric layer 210 and the passivation layer 214 surrounding these elements. Up to here, a transistor TX2-D in accordance with some embodiments of the present disclosure is accomplished. Similar to the above embodiment, since the transistor TX2-D includes a gate electrode 204 having a first gate material layer 204B and a second gate material layer 204C, the transistor TX2-D may meet various demands of having a high work function, low resistivity and low surface roughness properties, and stable control of the gate electrode 204 may be ensured.

Figure 6A:
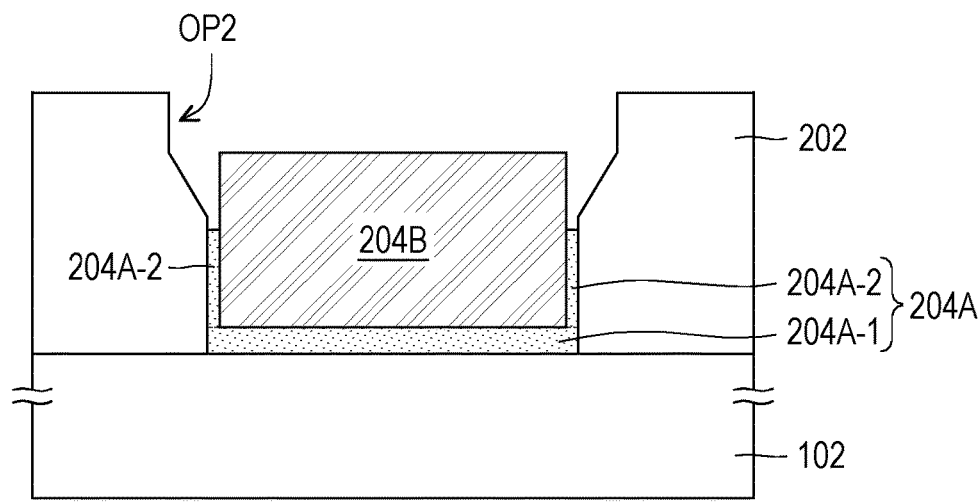
FIG. 6A to FIG. 6C are schematic cross-sectional views illustrating various stages in a method of fabricating a transistor as shown in FIG. 1 according to some other embodiments of the disclosure.
Figure 6B:
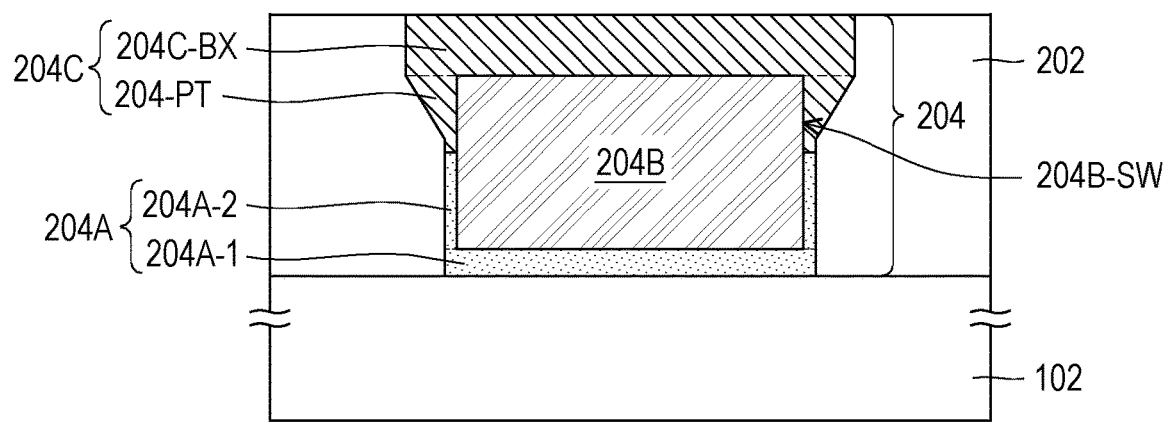
Figure 6C:
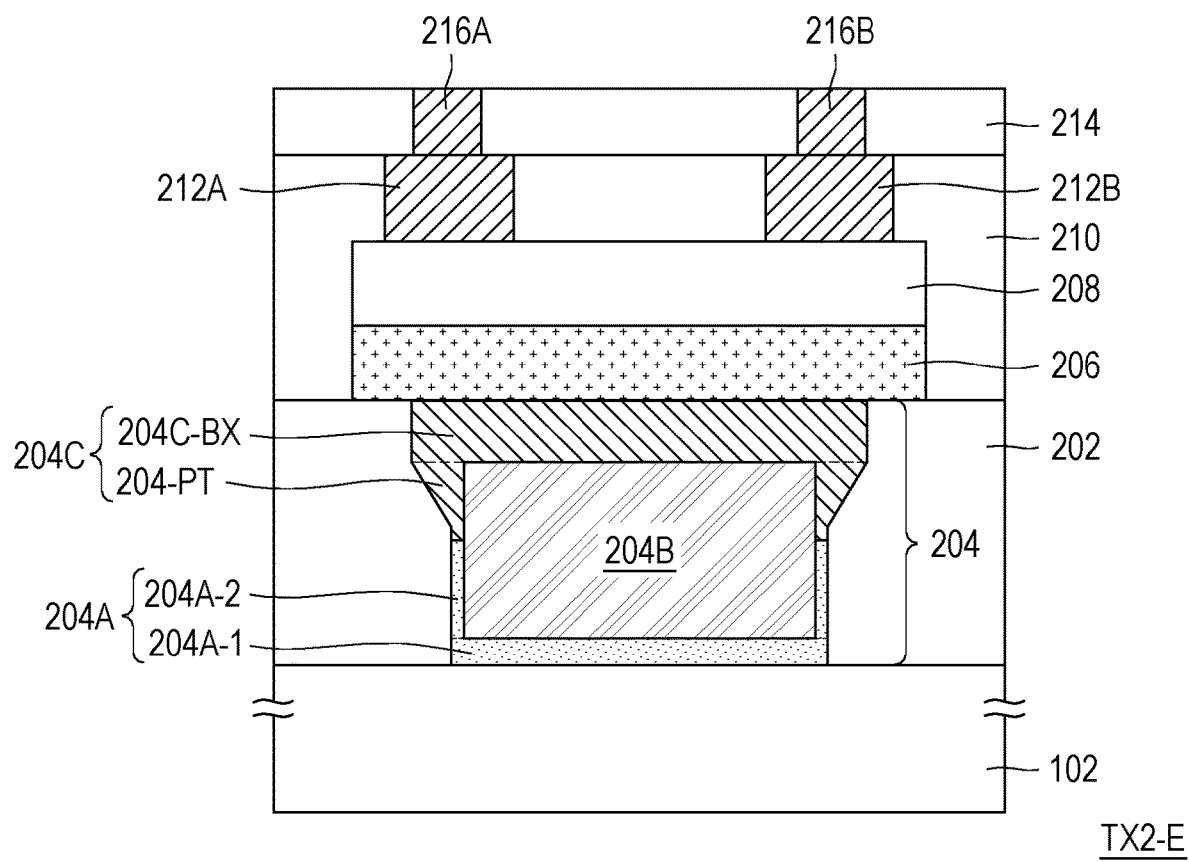

FIG. 6A to FIG. 6C are schematic cross-sectional views illustrating various stages in a method of fabricating a transistor as shown in FIG. 1 according to some other embodiments of the disclosure. The method illustrated in FIG. 6A to FIG. 6C is similar to the method illustrated in FIG. 2A to FIG. 2L. Therefore, the same reference numerals are used to refer to the same or liked parts, and its detailed description will be omitted herein. Referring to FIG. 6A, the same steps shown in FIG. 2A to FIG. 2E may be performed to form the first gate material layer 204B over the glue layer 204A. However, during an etching process (or etch back process) to remove the portions of the glue layer 204A and portions of the first gate material layer 204B to form the second opening OP2, the glue layer 204A may be over-etched. Furthermore, portions of the dielectric layer 202 may be removed to form the second opening OP2.

Referring to FIG. 6B, in a subsequent step, a second gate material layer 204C is formed in the second opening OP2 and on the first gate material layer 204B and on the glue layer 204A. Due to the over-etched glue layer 204A and the partially removed dielectric layer 202, the second gate material layer 204C may fill into gaps between the dielectric layer 202 and sidewalls 204B-SW of the first gate material layer 204B. In other words, the second gate material layer 204C may be formed with a body portion 204C-BX and a protruding portion 204C-PT. For example, the protruding portion 204C-PT is a tapered protruding portion 204C-PT (e.g. having tapered sidewalls). In some embodiments, the tapered protruding portion 204C-PT is covering sidewalls 204B-SW of the first gate material layer 204B, and the body portion 204C-BX is located on the top surface of the first gate material layer 204B, and connected to the tapered protruding portion 204C-PT. In some embodiments, the sidewall portions 204A-2 of the glue layer 204A is covering a portion of sidewalls 204B-SW of the first gate material layer 204B, and the tapered protruding portion 204C-PT of the second gate material layer 204C is covering another portion of the sidewalls 204B-SW of the first gate material layer 204B. Furthermore, the sidewall portions 204A-2 of the glue layer 204A may be connected to the tapered protruding portion 204C-PT of the second gate material layer 204C.

Referring to FIG. 6C, the same steps shown in FIG. 2I to FIG. 2L may be performed to form the gate dielectric 206, the channel layer 208, the source line 212A and bit line 212B, and the source line contact 216A and bit line contact 216B over the gate electrode 204, and to form the dielectric layer 210 and the passivation layer 214 surrounding these elements. Up to here, a transistor TX2-E in accordance with some embodiments of the present disclosure is accomplished. Similar to the above embodiment, since the transistor TX2-E includes a gate electrode 204 having a first gate material layer 204B and a second gate material layer 204C, the transistor TX2-E may meet various demands of having a high work function, low resistivity and low surface roughness properties, and stable control of the gate electrode 204 may be ensured.

Figure 7:
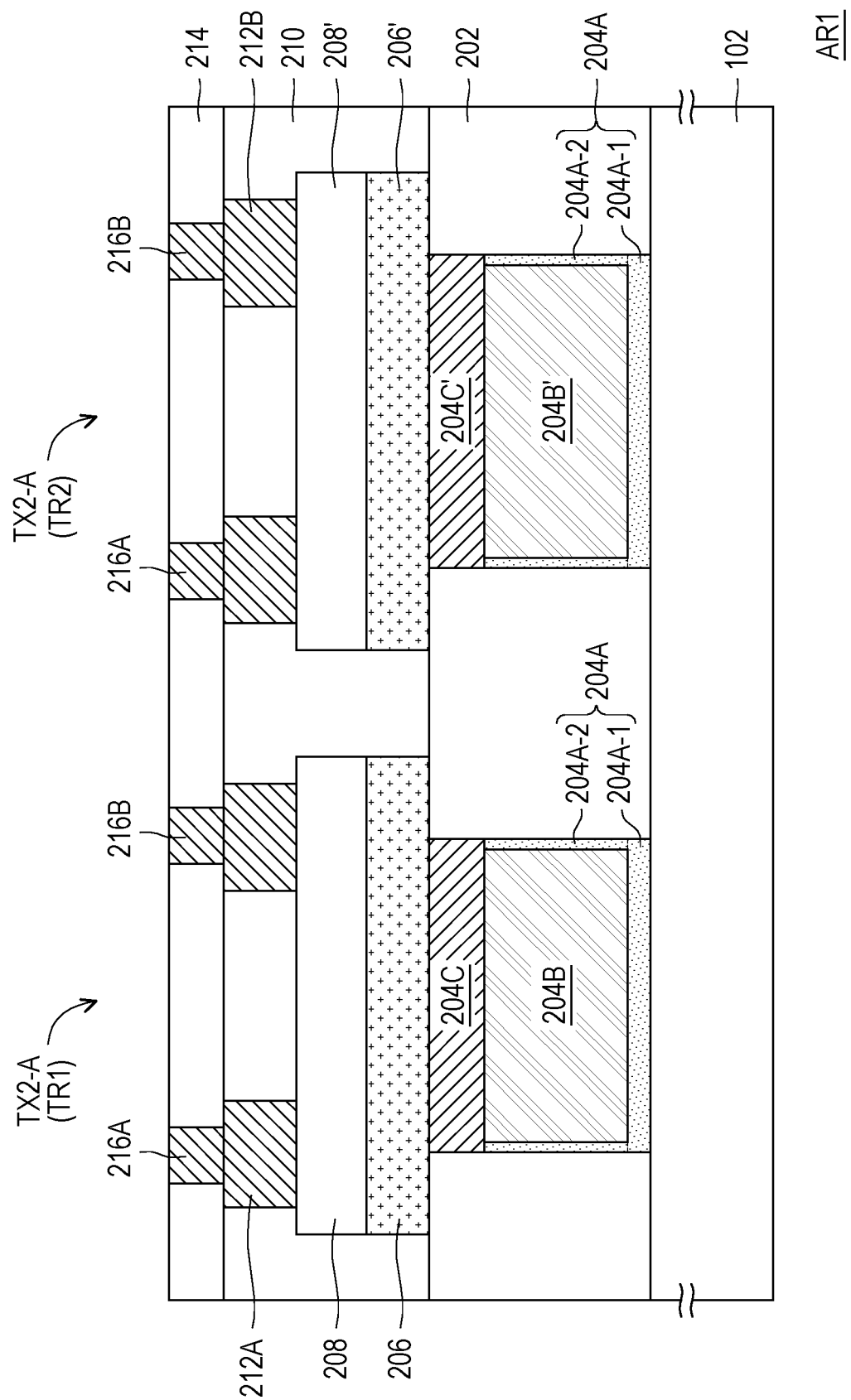
FIG. 7 is a schematic cross-sectional view of a portion of a transistor array in accordance with some embodiments of the present disclosure.

FIG. 7 is a schematic cross-sectional view of a portion of a transistor array in accordance with some embodiments of the present disclosure. In the above embodiments, only one transistor is illustrated. However, it should be noted that the integrated circuit 100 shown in FIG. 1 will include an array of transistors. For example, the integrated circuit 100 shown in FIG. 1 may include the transistor array AR1 shown in FIG. 7. In some embodiments, the transistor array AR1 includes two of the transistor TX2-A shown in FIG. 2L, whereby one of the transistor TX2-A is a first transistor TR1, and another one of the transistor TX2-A is a second transistor TR2.

In the exemplary embodiment, the first transistor TR1 includes at least the first gate material layer 204B, a second gate material layer 204C, a gate dielectric 206 and a channel layer 208 sequentially stacked up along the build-up direction. The resistivity of the first gate material layer 204B is lower than a resistivity of the second gate material layer 204C, and a work function of the first gate material layer 204B is lower than a work function of the second gate material layer 204C. Similarly, the second transistor TR2 includes at least a third gate material layer 204B', a fourth gate material layer 204C', a second gate dielectric 206' and a second channel layer 208' sequentially stacked up along the build-up direction. The resistivity of the third gate material layer 204B' is lower than a resistivity of the fourth gate material layer 204C', and a work function of the third gate material layer 204B' is lower than a work function of the fourth gate material layer 204C'. The materials of the third gate material layer 204B', fourth gate material layer 204C', second gate dielectric 206' and the second channel layer 208' may be similar to that described for the first gate material layer 204B, second gate material layer 204C, gate dielectric 206 and the channel layer 208, thus their details will not be repeated herein. In some other embodiments, the materials of the first gate material layer 204B and second gate material layer 204C of the first transistor TR1 may be different to the materials of the third gate material layer 204B' and fourth gate material layer 204C' of the second transistor TR2 as long as the above resistivity and work function relationship between the gate material layers are fulfilled.

Figure 8:
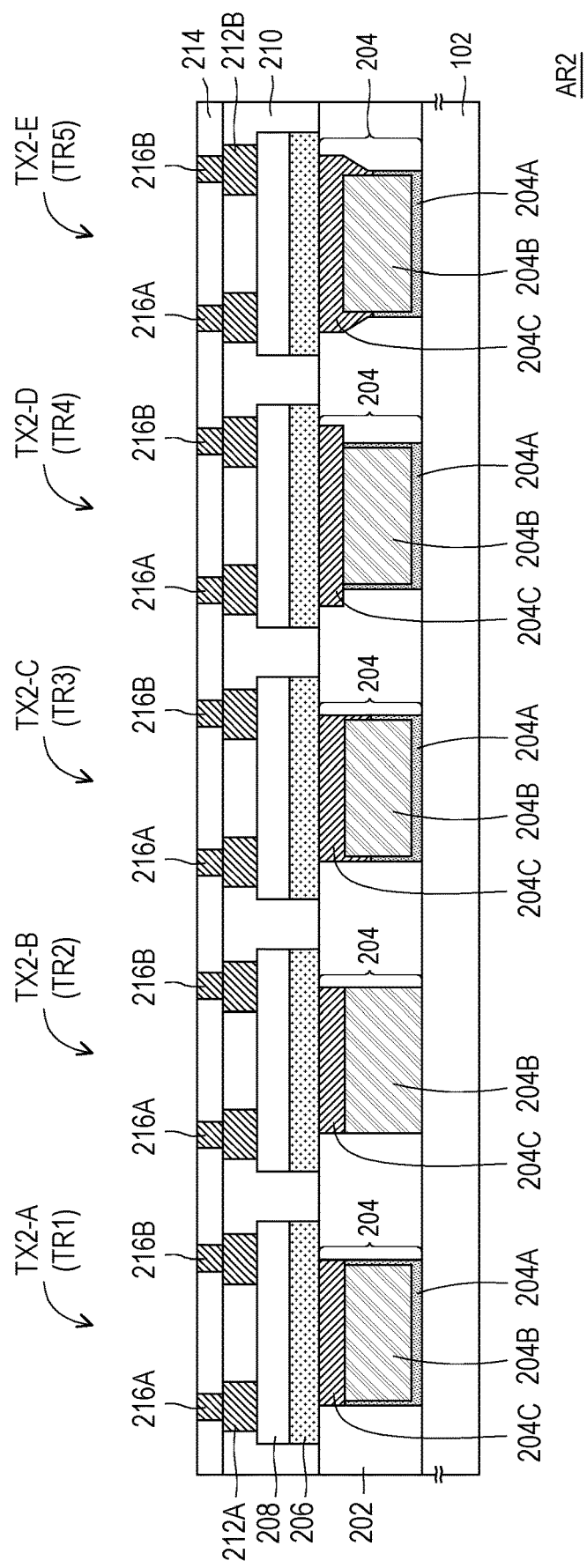
FIG. 8 is a schematic cross-sectional view of a portion of a transistor array in accordance with some other embodiments of the present disclosure.

FIG. 8 is a schematic cross-sectional view of a portion of a transistor array in accordance with some other embodiments of the present disclosure. In the above embodiments, a single transistor, or a transistor array having two transistors are illustrated. However, it is noted that the transistor array may in fact include more than two transistors. For example, as shown in FIG. 8, a transistor array AR2 including all of the transistor TX2-A (a first transistor TR1), the transistor TX2-B (a second transistor TR2), the transistor TX2-C (a third transistor TR3), the transistor TX2-D (a fourth transistor TR4), and the transistor TX2-E (a fifth transistor TR5) described above may be exemplified. In other words, when two or more transistors exists in the transistor array of the integrated circuit 100 shown in FIG. 1, each of the transistors in the transistor array may independently be the transistor TX2-A, the transistor TX2-B, the transistor TX2-C, the transistor TX2-D, or the transistor TX2-E. As such, any combination of the above transistors may be included in the transistor array of the embodiments. Furthermore, although the transistors (TX2-A to TX2-E) shown in FIG. 8 are shown to be located at the same level, it is noted that these transistors (TX2-A to TX2-E) may in fact be located at different levels (e.g. surrounded by different dielectric layers 104A) in the interconnection layer 104 of the integrated circuit 100.

In the above-mentioned embodiments, the transistor includes at least a first gate material layer and a second gate material layer disposed on the first gate material layer, whereby a work function of the first gate material layer is lower than a work function of the second gate material layer, and a resistivity of the first gate material layer is lower than a resistivity of the second gate material layer. As such, the transistor may meet various demands of having a high work function, low resistivity and low surface roughness properties, and stable control of the gate electrode may be ensured.

In accordance with some embodiments of the present disclosure, a transistor includes a gate electrode, a gate dielectric, a channel layer and a source line and bit line. The gate electrode includes a first gate material layer and a second gate material layer disposed on the first gate material layer, wherein a work function of the first gate material layer is lower than a work function of the second gate material layer. The gate dielectric is disposed on the gate electrode. The channel layer is disposed on the gate dielectric. The source line and bit line are disposed on and connected to the channel layer.

In accordance with some other embodiments of the present disclosure, an integrated circuit includes a substrate, an interconnection layer, and a transistor array. The interconnection layer is disposed on the substrate, wherein the interconnection layer includes a plurality of dielectric layers and a plurality of conductive layers alternately stacked up along a build-up direction. The transistor array is located in between the plurality of dielectric layers, wherein the transistor array includes a first transistor. The first transistor includes a first gate material layer, a second gate material layer, a gate dielectric and a channel layer sequentially stacked up along the build-up direction, wherein a resistivity of the first gate material layer is lower than a resistivity of the second gate material layer. At least one of the plurality of dielectric layers is surrounding the first gate material layer and the second gate material layer.

In accordance with yet another embodiment of the present disclosure, a method of fabricating a transistor is described. The method includes the following steps. A dielectric layer is formed on a substrate. The dielectric layer is patterned to form a first opening in the dielectric layer. The first gate material layer is formed in the first opening. Portions of the first gate material layer is removed to form a second opening. A second gate material layer is formed in the second opening and on the first gate material layer, wherein the first gate material layer and the second gate material layer constitutes a gate electrode of the transistor, and a work function of the first gate material layer is lower than a work function of the second gate material layer. A gate dielectric is formed on the gate electrode. A channel layer is formed on the gate dielectric. A source line and a bit line are formed to be disposed on and connected to the channel layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A transistor, comprising: a substrate, a gate electrode, comprising a first gate material layer and a second gate material layer disposed on the first gate material layer, wherein a material of the first gate material layer is selected from the group consisting of titanium nitride (TiN), copper (Cu), cobalt (Co) and gold (Au), and a material of the second gate material layer is selected from the group consisting of tungsten (W), tungsten carbon nitride (WCN), tantalum nitride (TaN), nickel (Ni), and chromium (Cr), and a work function of the first gate material layer is lower than a work function of the second gate material layer; a gate dielectric disposed on the gate electrode; a channel layer disposed on the gate dielectric; and a source line and a bit line disposed on and connected to the channel layer, wherein the substrate, the first gate material layer, the second gate material layer, the gate dielectric, and the channel layer are sequentially stacked up along a stacking direction, a thickness of the first gate material layer measured along the stacking direction is greater than a thickness of the second gate material layer measured along the stacking direction, and a lateral dimension of the first gate material layer measured along a second direction perpendicular to the stacking direction is smaller than a lateral dimension of the second gate material layer measured along the second direction.

2. The transistor according to claim 1, wherein a resistivity of the first gate material layer is lower than a resistivity of the second gate material layer.

3. The transistor according to claim 1, wherein the gate electrode further comprises a glue layer, and the first gate material layer is sandwiched in between the glue layer and the second gate material layer.

4. The transistor according to claim 3, wherein the glue layer covers a portion of sidewalls of the first gate material layer, and the second gate material layer is covering another portion of the sidewalls of the first gate material layer, and the glue layer is contacting the second gate material layer.

5. The transistor according to claim 1, wherein a lateral dimension of the second gate material layer is greater than a lateral dimension of the first gate material layer.

6. The transistor according to claim 3, wherein the second gate material layer comprises a body portion and a protruding portion, and the protruding portion is connected to the glue layer.

7. The transistor according to claim 6, wherein the protruding portion is a tapered protruding portion.

8. The transistor according to claim 1, wherein a ratio of the thickness of the second gate material layer to the thickness of the first gate material layer is in a range of 1:2 to 1:50.

9. An integrated circuit, comprising:
a substrate;
an interconnection layer disposed on the substrate, wherein the interconnection layer comprises a plurality of dielectric layers and a plurality of conductive layers alternately stacked up along a build-up direction;
a transistor array located in between the plurality of dielectric layers, wherein the transistor array comprises a first transistor, the first transistor comprising:
  a glue layer, a first gate material layer, a second gate material layer, a gate dielectric and a channel layer sequentially stacked up along the build-up direction, wherein a resistivity of the first gate material layer is lower than a resistivity of the second gate material layer, and
  at least one of the plurality of dielectric layers is surrounding the first gate material layer and the second gate material layer,
  wherein the first gate material layer is sandwiched in between the glue layer and the second gate material layer,
  the first gate material layer has a top surface, a bottom surface opposite to the top surface and side surfaces joining the top surface to the bottom surface,
  the glue layer has a base portion and sidewall portions connected to the base portion, wherein the base portion is covering and contacting the bottom surface, and the sidewall portions is covering and contacting a lower portion of the side surfaces of the first gate material layer, and
  the second gate material layer comprises a body portion and a protruding portion, wherein the body portion is covering and contacting the top surface, and the protruding portion extends from the top surface towards the glue layer to cover an upper portion of the side surfaces of the first gate material layer.

10. The integrated circuit according to claim 9, wherein the protruding portion of the second gate material layer is directly connected to the sidewall portions of the glue layer.

11. The integrated circuit according to claim 9, wherein a thickness of the base portion is greater than a thickness of the sidewall portions.

12. The integrated circuit according to claim 9, wherein the first gate material layer is a crystalline layer and the second gate material layer is an amorphous layer.

13. The integrated circuit according to claim 9, wherein the transistor array further comprises a second transistor, the second transistor comprising:
  a third gate material layer, a fourth gate material layer, a second gate dielectric and a second channel layer sequentially stacked up along the build-up direction, wherein a work function of the third gate material layer is lower than a work function of the third gate material layer.

14. A method of fabricating a transistor, comprising: forming a dielectric layer on a substrate; patterning the dielectric layer to form a first opening in the dielectric layer; forming a first gate material layer in the first opening, wherein a material of the first gate material layer is selected from the group consisting of titanium nitride (TiN), copper (Cu), cobalt (Co) and gold (Au); removing portions of the first gate material layer to form a second opening; forming a second gate material layer in the second opening and stacked on the first gate material layer, wherein a material of the second gate material layer is selected from the group consisting of tungsten (W), tungsten carbon nitride (WCN), tantalum nitride (TaN), nickel (Ni), and chromium (Cr), and the first gate material layer and the second gate material layer constitutes a gate electrode of the transistor, and a work function of the first gate material layer is lower than a work function of the second gate material layer, wherein a thickness of the first gate material layer measured along a stacking direction is greater than a thickness of the second gate material layer measured along the stacking direction, and a lateral dimension of the first gate material layer measured along a second direction perpendicular to the stacking direction is smaller than a lateral dimension of the second gate material layer measured along the second direction; forming a gate dielectric on the gate electrode; forming a channel layer on the gate dielectric, wherein the substrate, the first gate material layer, the second gate material layer, the gate dielectric, and the channel layer are sequentially stacked up along the stacking direction; and forming a source line and a bit line disposed on and connected to the channel layer.

15. The method according to claim 14, further comprising forming a glue layer in the first opening prior to forming the first gate material layer, and forming the first gate material layer on the glue layer in the first opening.

16. The method according to claim 15, further comprising removing portions of the glue layer and removing portions of the first gate material layer in the same step.

17. The method according to claim 16, wherein the glue layer is removed so that a top surface of the first gate material layer is located above a top surface of the glue layer.

18. The method according to claim 15, wherein the second gate material layer is formed to cover sidewalls of the first gate material layer, and the second gate material layer is contacting the glue layer.

19. The transistor according to claim 3, wherein a topmost surface of the glue layer is located at a level below a topmost surface of the first gate material layer.

20. The integrated circuit according to claim 9, wherein the protruding portion of the second gate material layer is a tapered protruding portion having tapered sidewalls.

* * * * *